United States Patent

Coffey et al.

Patent Number: 6,016,241
Date of Patent: *Jan. 18, 2000

[54] MAGNETORESISTIVE SENSOR UTILIZING A GRANULAR MAGNETORESISTIVE LAYER

[75] Inventors: Kevin Robert Coffey, San Jose; James Kent Howard, Morgan Hill; Todd Lanier Hylton, San Jose; Michael Andrew Parker, Fremont, all of Calif.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/445,479

[22] Filed: May 22, 1995

Related U.S. Application Data

[62] Division of application No. 08/079,656, Jun. 18, 1993, abandoned.

[51] Int. Cl.[7] .................................................... G11B 5/39
[52] U.S. Cl. ............................................................. 360/113
[58] Field of Search .............................. 360/113; 324/252; 338/32 R; 148/300, 305; 428/402, 557, 558, 561, 611

[56] References Cited

U.S. PATENT DOCUMENTS

| | | | |
|---|---|---|---|
| 4,609,950 | 9/1986 | Chiba et al. | 360/110 |
| 4,663,242 | 5/1987 | Pryor et al. | 428/558 |
| 4,896,235 | 1/1990 | Takino et al. | 360/113 |
| 4,949,039 | 8/1990 | Grunberg | 324/252 |
| 5,043,693 | 8/1991 | Edelstein | 332/32 |
| 5,159,513 | 10/1992 | Dieny et al. | 360/113 |
| 5,206,590 | 4/1993 | Dieny et al. | 324/252 |
| 5,268,043 | 12/1993 | McCowen | 148/310 |
| 5,462,809 | 10/1995 | Berkowitz | 428/611 |

FOREIGN PATENT DOCUMENTS 2238306A  5/1991  United Kingdom .

OTHER PUBLICATIONS

J. Q. Xiao et al., "Giant Magnetoresistance In Nonmultilayer Magnetic Systems", Physical Review Letters, vol. 68, No. 25, Jun. 22, 1992, pp. 3749–3752.

D. A. Thompson et al., "Thin Film Magnetoresistors in Memory, Storage, and Related Applications", IEEE Transactions on Magnetics, vol. MAG–11, No. 4, Jul. 1975, pp. 1039–1050.

H. Suyama et al., "Thin Film MR Head For High Density Rigid Disk Drive", IEEE Transactions on Magnetics, vol. 24, No. 6, Nov. 1988, pp. 2612–2614.

A. E. Berkowitz et al., "Giant Magnetoresistance in Heterogeneous Cu–Co Alloys", Physical Review Letters, vol. 68, No. 25, Jun. 22, 1992, pp. 3745–3748.

J. A. Barnard et al., "'Giant' magnetoresistance observed in single layer Co–Ag alloy films", Letter To The Editor, Journal of Magnetism and Magnetic Materials, 114(1992), pp. L230–234.

J. S. Jiang et al., "Magnetic properties and giant magnetoresistance of granular permalloy in silver", Appl. Phys. Lett. 61(19), Nov. 9, 1992, pp. 2362–2364.

C.L. Chien, "Granular Magnetic Solids," J. Appl. Phys. 69(8), Apr. 15, 1991, pp. 5267–5272.

J.R. Childress et al, "Granular Cobalt in a Metallic Matrix" J. Appl. Phys. 70(10) Nov. 15, 1991, pp. 5885–5887.

Primary Examiner—David D. Davis
Attorney, Agent, or Firm—Leslie G. Murray; Paik Saber

[57] ABSTRACT

A heterogeneous thin film structure including a discontinuous layer of ferromagnetic material deposited on an insulating substrate and overcoated with a layer of nonmagnetic electrically conductive material exhibits giant magnetoresistance in saturation fields on the order of 350 Oersteds. A layer of ferromagnetic material is deposited on a heated insulating substrate by high vacuum evaporation techniques to form a layer of isolated ferromagnetic particles and overcoated with a nonmagnetic conductive material to form a plurality of ferromagnetic particles embedded in a nonmagnetic conductive matrix. As the ferromagnetic and nonmagnetic materials are deposited separately, it is not required that the two materials be immiscible and subsequent annealing is not required to induce phase separation.

4 Claims, 5 Drawing Sheets

MAGNETORESISTIVE SENSOR UTILIZING A GRANULAR MAGNETORESISTIVE LAYER

This is a divisional of application Ser. No. 08/079,656 filed on Jun. 18, 1993 now abandoned.

BACKGROUND OF THE INVENTION

The present invention relates generally to magnetic transducers for reading information signals recorded in a magnetic medium and, more particularly, to a magnetoresistive read sensor based on the giant magnetoresistance exhibited by a single layer of individual ferromagnetic particles fixed in a matrix of nonmagnetic conductive material.

It is well-known in the prior art to utilize a magnetic read transducer referred to as a magnetoresistive (MR) sensor or head for reading high density recorded data from magnetic media. An MR sensor detects magnetic field signals through the resistance changes of a read element fabricated of a magnetic material as a function of the strength and direction of magnetic flux being sensed by the read element. These prior art MR sensors operate on the basis of the anisotropic magnetoresistive (AMR) effect in which a component of the read element resistance varies as the square of the cosine ($cos^2$) of the angle between the magnetization and the direction of sense current flow through the read element. A more detailed description of the AMR effect can be found in "Memory, Storage, and Related Applications", D. A. Thompson et al., IEEE Trans. Mag. MAG-11, p. 1039 (1975).

U.S. Pat. No. 4,896,235 entitled "Magnetic Transducer Head Utilizing Magnetoresistance Effect", granted to Takino et al on Jan. 23, 1990, discloses a multilayered magnetic sensor which utilizes the AMR and comprises first and second magnetic layers separated by a nonmagnetic layer in which at least one of the magnetic layers is of a material exhibiting the AMR effect. The easy axis of magnetization in each of the magnetic layers is set perpendicular to the applied magnetic signal such that the current in the MR sensor element provides a magnetic field in the magnetic layers parallel to the easy axis thus eliminating or minimizing Barkhausen noise in the sensor. "Thin Film MR Head for High Density Rigid Disk Drive" by H. Suyama et al, IEEE Trans. Mag., Vol. 24, No. 6, 1988 (pages 2612–2614) discloses a multilayered MR sensor similar to that disclosed by Takino et al.

A second, different and more pronounced magnetoresistive effect has also been described in which the change in resistance of a layered magnetic sensor is attributed to the spin-dependent transmission of conduction electrons between ferromagnetic layers via a nonmagnetic layer separating the ferromagnetic layers and the accompanying spin-dependent scattering at the layer interfaces. This magnetoresistive effect is variously referred to as the "giant magnetoresistive" or "spin valve" effect. Such a magnetoresistive sensor fabricated of the appropriate materials provides improved sensitivity and greater change in resistance than observed in sensors utilizing the AMR effect. In this type of MR sensor, the in-plane resistance between a pair of ferromagnetic layers separated by a nonmagnetic layer varies as the cosine (cos) of the angle between the magnetization in the two layers.

U.S. Pat. No. 4,949,039 to Grunberg describes a layered magnetic structure which yields enhanced MR effects caused by antiparallel alignment of the magnetizations in the magnetic layers. As possible materials for use in the layered structure, Grunberg lists ferromagnetic transition metals and alloys, but does not indicate preferred materials from the list for superior MR signal amplitude. Grunberg further describes the use of antiferromagnetic-type exchange coupling to obtain the antiparallel alignment in which adjacent layers of ferromagnetic materials are separated by a thin interlayer of Cr or Y.

Co-pending U.S. patent application Ser. No. 07/625,343 filed Dec. 11, 1990, now U.S. Pat. No. 5,206,590 assigned to the instant assignee, discloses an MR sensor in which the resistance between two uncoupled ferromagnetic layers is observed to vary as the cosine of the angle between the magnetizations of the two layers and which is independent of the direction of current flow through the sensor. This mechanism produces a magnetoresistance that is based on the spin valve effect and, for selected combinations of materials, is greater in magnitude than the AMR.

U.S. Pat. No. 5,159,513 granted to Dieny et al on Oct. 27, 1992, assigned to the instant assignee, discloses an MR sensor based on the above-described effect which includes two thin film layers of ferromagnetic material separated by a thin film layer of a nonmagnetic metallic material wherein at least one of the ferromagnetic layers is of cobalt or a cobalt alloy. The magnetization of the one ferromagnetic layer is maintained perpendicular to the magnetization of the other ferromagnetic layer at zero externally applied magnetic field by exchange coupling to an antiferromagnetic layer.

The spin valve structures described in the above-cited U.S. patent and patent application require that the direction of magnetization in one of the two ferromagnetic layers be fixed or "Pinned" in a selected orientation such that under non-signal conditions the direction of magnetization in the other ferromagnetic layer is oriented perpendicular to the pinned layer magnetization. Additionally, in both the AMR and spin valve structures, in order to minimize Barkhausen noise, it is necessary to provide a longitudinal bias field to maintain at least the sensing portion of the read element in a single magnetic domain state. Thus, a means for both fixing the direction of the magnetization and providing a longitudinal bias field is required. For example, as described in the above-cited patent application and patents, an additional layer of antiferromagnetic material can be formed in contact with the ferromagnetic layer to provide an exchange-coupled bias field. Alternatively, an adjacent magnetically hard layer can be utilized to provide hard bias for the ferromagnetic layer.

Granular GMR was first observed in thin films of nickel (Ni) in a quartz matrix prepared by co-deposition. More recently granular GMR has been reported in co-deposited phase segregating thin films incorporating a metallic matrix, such as single layer alloy heterogeneous systems such as cobalt-copper (Co—Cu), cobalt-silver (Co—Ag) and nickel-iron-silver (NiFe—Ag). For example, see "GIANT MAGNETORESISTANCE IN NONMAGNETIC MAGNETIC SYSTEMS", John Q. Xiao et al, *PHYSICAL REVIEW LETTERS*, Vol. 68, No. 25, pages 3749–3752 (Jun. 22, 1992); "GIANT MAGNETORESISTANCE IN HETEROGENEOUS CU—CO ALLOYS", A. E. Berkowitz et al, *PHYSICAL REVIEW LETTERS*, Vol. 68, No. 25, pages 3745–3748 (Jun. 22, 1992); "'GIANT' MAGNETORESISTANCE OBSERVED IN SINGLE LAYER CO—AG ALLOY FILMS", J. A. Barnard et al, Letter to the Editor, *JOURNAL OF MAGNETISM AND MAGNETIC MATERIALS*, 114 (1992), pages L230–L234; and J. Jaing et al, *APPLIED PHYSICS LETTERS*, Vol. 61, page 2362 (1992). "The Co alloys are of materials that are immiscible at low temperatures. Annealing the metastable alloy causes the formation of fine Co precipitates, i.e., "grains", in a Cu or Ag matrix wherein the MR effect appears to vary inversely with the diameter of the average particle diameter.

SUMMARY OF THE INVENTION

It is a principle object of the present invention to provide a single-layer discontinuous magnetic film in which isolated particles of ferromagnetic material are embedded in a nonmagnetic, conducting matrix.

This and other objects and advantages are attained in accordance with the principles of the present invention, in which a granular magnetoresistive film comprises a first layer of a discontinuous or granular ferromagnet, consisting of isolated particles of ferromagnetic material, such as Ni or Co, for example, formed on-a heated insulating substrate. A nonmagnetic conductive matrix material, such as Cu, for example, is subsequently deposited onto the cooled substrate to provide conduction between the ferromagnetic particles. This bilayer structure differs significantly from co-deposited phase segregating thin films as reported in the prior art. The separate deposition of the ferromagnetic material provides control of the size and shape of the isolated ferromagnetic regions in the film, resulting in a reduction of the magnetic field required to observe magnetoresistance and eliminates the need for mutual insolubility of the ferromagnetic and matrix materials.

The granular magnetic film is formed by depositing a ferromagnetic film which is sufficiently thin and under conditions of sufficient surface mobility to provide a discontinuous thin film consisting of physically separated particles of ferromagnetic material on an insulating substrate. The ferromagnetic particles in the resulting film are not (or very poorly) electrically connected to one another or are non-percolating. Further, the ferromagnetic particles are not magnetically exchange-coupled to each other, and the magnetization of each Particle is random in direction. The granular ferromagnetic thin film is then overcoated with a thin film of a non magnetic, i.e., nonferromagnetic, electrically conductive material under conditions sufficient to provide a continuous overlaying thin film. The resistivity of the composite film will be high when the net magnetization of the ferromagnetic film is zero due to the spin dependent electron scattering of the randomly oriented ferromagnetic particles. Spin dependent scattering will decrease and the resistivity will be lowered when an external magnetic field is applied as the local magnetic moments tend to orient in the direction of the applied magnetic field and hence are locally aligned.

A preferred embodiment of the single layer granular magnetoresistive film according to the principles of the present invention comprises a thin layer of a ferromagnetic material, such as cobalt (Co), for example, deposited on a silicon oxide ($SiO_2$) coated silicon (Si) substrate by vacuum (UHV) deposition techniques at an elevated temperature. The film and substrate are then cooled and a thin film of a nonmagnetic conductive material, such as copper (Cu), for example, is deposited by UHV evaporation at room temperature. Since the deposition conditions for the ferromagnetic film are controlled to produce a discontinuous film, the resulting thin film structure provides ferromagnetic particles or islands embedded in a nonmagnetic conductive matrix. The structure can be subsequently annealed to promote further phase separation of the ferromagnetic layer to control particle size, shape and spacing. It is important to control the particle size and, to a lesser degree, the particle shape by careful processing (i.e., substrate temperature during deposition, deposition rate, anneal temperatures, for example) to obtain optimal magnetoresistive effect. It is desirable that the particle spacing within the conductive matrix be less than the mean free path of the carriers within the matrix material while insuring magnetic isolation between the particles. Additionally, it is desirable to have the ferromagnetic material be the largest possible volume fraction to avoid conduction without spin polarization. The coercivity of the ferromagnetic particles is also determined by particle size and shape, and other magnetic anisotropic characteristics of the material.

Prior art MR sensors require substantially single domain behavior of the ferromagnetic MR element and suffer from Barkhausen noise when domain wall motion (rather than magnetization rotation) occurs thus requiring the use of magnetic bias fields to maintain the signal sensing portion of the MR sensor in a single magnetic domain state. The inherent multi-domain nature of the granular MR film of the present invention with independent ferromagnetic particle switching, rotation, results in minimum or no domain wall motion within the individual particles. Any noise associated with the rotation of a single particle will be small as long as the sensor area is sufficient to allow many such particles.

Thus, the present invention provides a MR sensor in which the magnetoresistive sensing element constitutes a plurality of magnetic domains in which the individual magnetic moments rotate in response to an applied magnetic field signal. Since the response is the result of the rotation of the magnetic moments with limited domain wall motion, the need for a longitudinal bias field to minimize Barkhausen noise is eliminated.

BRIEF DESCRIPTION OF THE DRAWINGS

The foregoing and other objects, features and advantages of the present invention will be apparent from the following detailed description of the preferred embodiments of the invention, reference being made to the accompanying drawings, in which like reference numerals indicate like parts and in which.

DETAILED DESCRIPTION OF THE PREFERRED EMBODIMENTS

Figure 1:
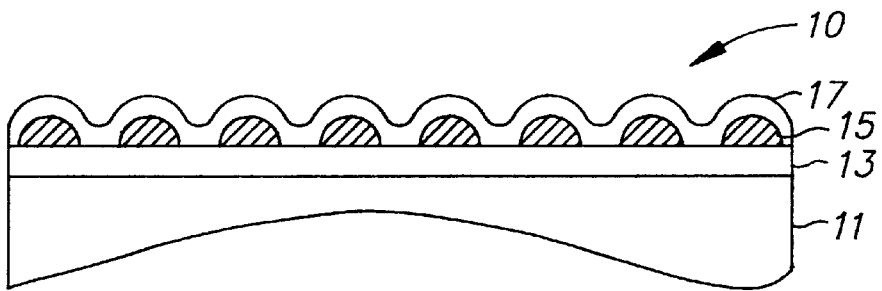
FIG. 1 is a cross-sectional view illustrating a single layer granular magnetoresistive film fabricated by vacuum evaporation techniques according to the principles of the present invention.
Figure 2:
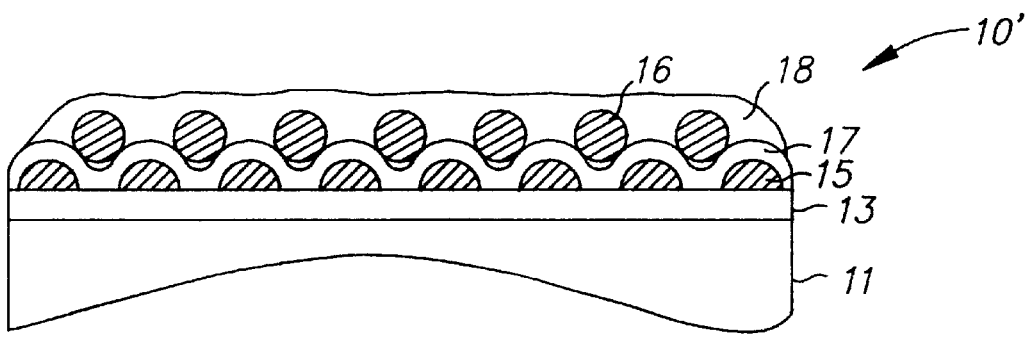
FIGS. 2 and 3 are cross-sectional views illustrating multilayer granular magnetoresistive films fabricated according to the principles of the present invention.
Figure 3:
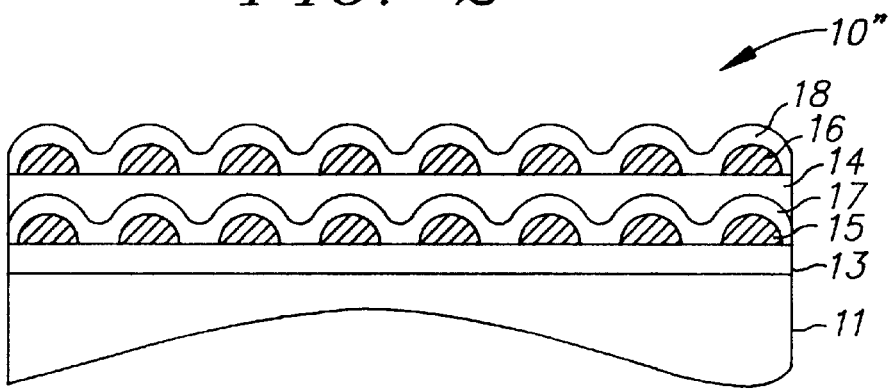

Referring now to FIGS. 1, 2 and 3, FIG. 1 is a cross-sectional view illustrating a single layer granular magnetoresistive (MR) film fabricated according to the principles of the present invention. The granular MR film 10 comprises a discontinuous layer of ferromagnetic material, such as NiFe or Co, for example, deposited on a nonconductive layer 13 over a suitable substrate 11 to form a layer of ferromagnetic islands or particles 15. The layer of ferromagnetic material is deposited by evaporation or sputtering under ultra high vacuum conditions (UHV) and high substrate temperatures to provide sufficient mobility to allow the particles 15 of ferromagnetic material to form on the substrate overlayer 13. The substrate is then cooled and a continuous layer 17 of a nonmagnetic, electrically conductive material, such as Cu or Ag, for example, is deposited over the layer of ferromagnetic particles 15 by vacuum evaporation deposition thus forming a granular MR film wherein ferromagnetic particles 15 are embedded in a nonmagnetic, conductive matrix 17.

Suitable ferromagnetic materials are Fe, Co, Ni, NiFe and ferromagnetic alloys based on Fe, Co, Ni or NiFe. Suitable matrix materials are Au, Ag, CLI, ruthenium (Ru), palladium (Pd), rhodium (Rh) and conductive oxides such as cobalt oxide and nickel oxide, for example.

It is necessary to closely control the deposition parameters for the ferromagnetic layer, such as substrate temperature, deposition rate and layer thickness, for example, to ensure formation of the ferromagnetic particles 15 having the desired size, shape and distribution. Ideally, the particles 15 will be all of generally the same shape and size. The size and shape of the particles 15 should be such as to form single magnetic domains within each particle and minimize shape anisotropy within the film. The observed MR effect, in general, is inversely proportional to the ferromagnetic particle size. If the particle 15 dimensions are too large, the MR is reduced. Conversely, if the particle 15 dimensions are too small, large magnetic fields are required to produce an MR effect due to superparamagnetism. A suitable range for the ferromagnetic particles to provide a practical MR sensor is in the range of 10 Å to 1000 Å. The particles 15 should be separated by a distance less than the mean free path length for a conduction electron in the nonmagnetic matrix material, but having sufficient separation to minimize magnetic coupling. In an actual sample, there will be some variation in particle 15 size and shape and in separation distance for a given structure 10.

In a specific embodiment, an 80 Angstroms (Å) (equivalent thickness) layer of Co is deposited on a 700 Å thermal oxide layer 13 ($SiO_2$) of a Si substrate 11 at 200 degrees C to form a discontinuous layer of ferromagnetic Co particles 15. The deposition is by electron beam evaporation in a chamber having a base pressure less than 10 mbar at deposition rates of approximately 0.2 Å/second. Sputter deposition or other suitable vacuum thin film deposition techniques can also be used. The characteristic diameter of the particles 15 is approximately 300 Å with an irregular oblate or pancake shape with a diameter approximately three times the thickness and an in-plane aspect ratio that is on the order of two. In general, similar shapes were obtained at larger and smaller length scales by simultaneous variation of the deposited ferromagnetic material thickness and substrate temperature. The choice of substrate is important, with the thermally oxidized wafer surface 13 providing equivalent structures at lower temperatures than may be obtained with glass substrates. A nonmagnetic conductive layer 17 of Cu, 80 Å thick, is subsequently deposited after the substrate is cooled to room temperature 20 degrees C, for example. Similar depositions of Cu on substrates without prior Co or NiFe deposition were marginally or non-percolating, indicating that the combined deposition of both layers is required to form a contiguous matrix film.

Figure 4:
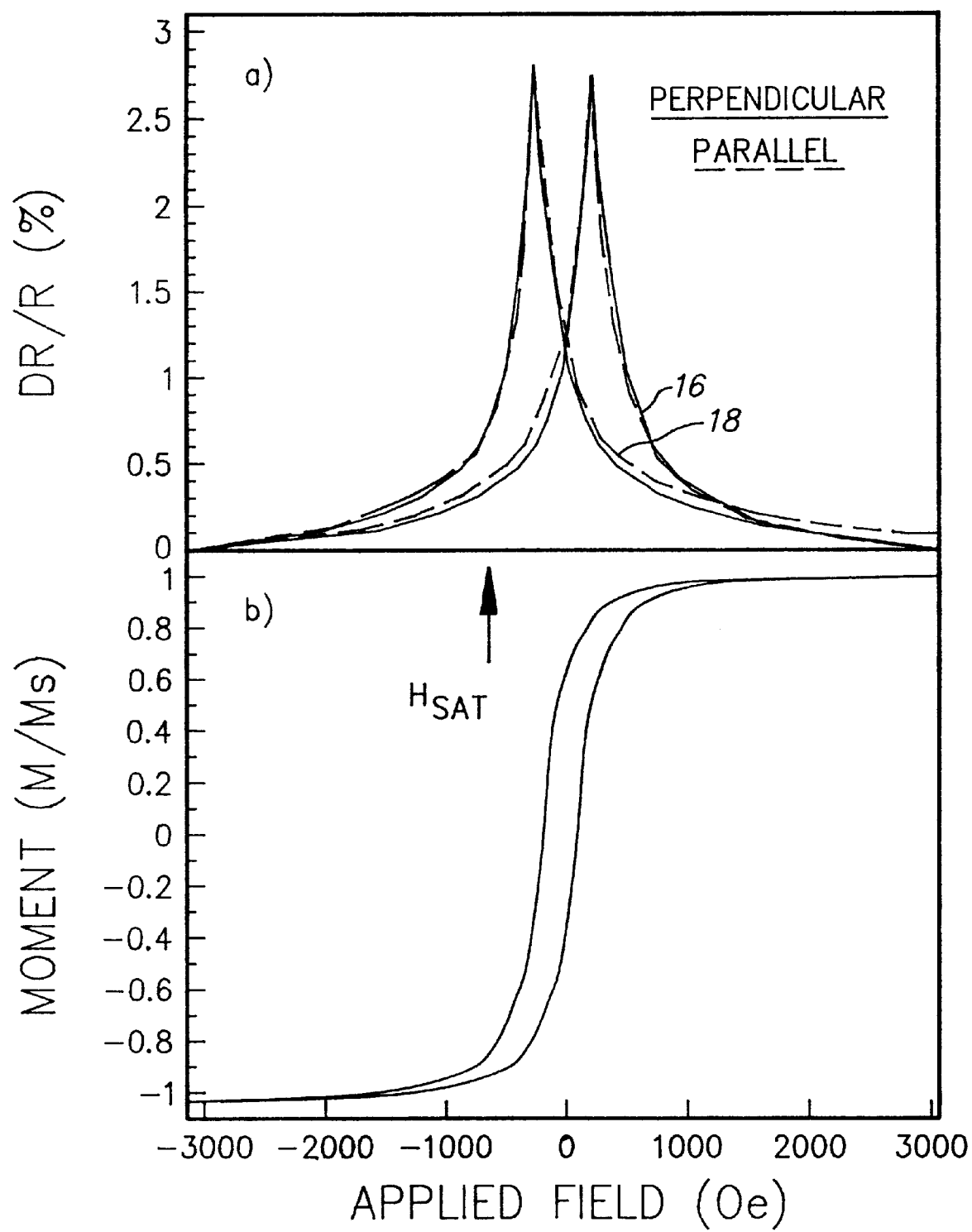
FIG. 4 is a graph illustrating the magnetoresistance versus applied magnetic field and magnetic moment versus applied magnetic field for the granular magnetoresistive film shown in FIG. 1.

Referring now also to FIGS. 2 and 3, the magnitude of the MR obtained with granular ferromagnetic films can be significantly increased with additional layers of particles and nonmagnetic material. FIG. 3 is a cross-sectional view illustrating another preferred embodiment of the granular MR film 10 shown in FIG. 1. The granular MR film 10' comprises two discontinuous layers of ferromagnetic particles 15 and 16, each covered with a continuous layer 17 and 18, respectively, of a nonmagnetic conductive material to provide multiple layers of ferromagnetic particles 15, 16 in a nonmagnetic conductive matrix. Multiple particle conductive layers 16/18 will enhance the MR obtained significantly, but the bulk of the increases will be observed with the first two or three layers. Additional layers 15, 16 of ferromagnetic particles both increase the number of particles 15, 16 and increase the number of near neighbors for a particular particle thus increasing the number of scattering sites for the conduction electrons. Additionally the ratio of the volumes of ferromagnetic material to conductive material decreases thus decreasing the amount of current shunting by the conductive matrix material. The granular MR film 10' is fabricated in the same manner using UHV deposition techniques as described above with reference to FIG. 1. Since the discontinuous ferromagnetic layer 16 is formed on a heated substrate, the nonmagnetic conductive material forming the underlaying matrix layer 17 must having a melting point that is greater than the temperature required for formation of the ferromagnetic particles 16 to minimize interdiffusion between the previously deposited matrix layers and the ferromagnetic material. For example, Ru which has a relatively high melting temperature compared to Co is be a suitable matrix material for this embodiment 10'. FIG. 4 illustrates a second embodiment of a multilayer granular MR film 10" which includes an isolation layer 14 of a suitable material, such as $SiO_2$, for example, deposited over the matrix layer 17 to provide a surface for deposition of the discontinuous ferromagnetic layer 16. While the use of the isolation layer 14 eases the deposition conditions required to form the subsequent layers of ferromagnetic particles 16, the improvement in MR magnitude is not as great as observed for the granular multilayer film 10' because the isolation layer 14 effectively prevents any interlayer scattering between the ferromagnetic particles 15 and 16.

Figure 5:
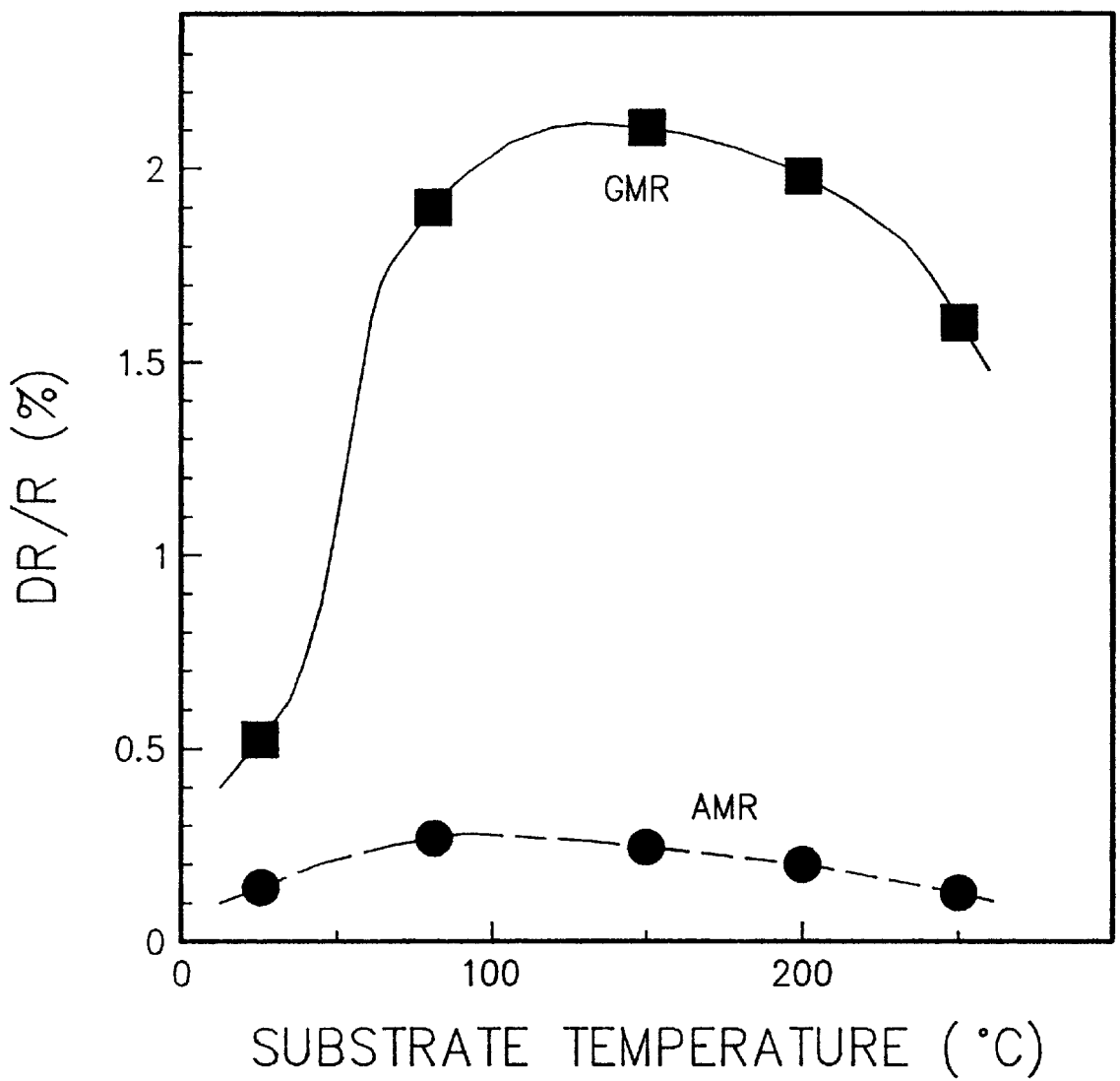
FIG. 5 is a graph illustrating the magnetoresistance as a function of the substrate temperature during the magnetic material deposition for the granular magnetoresistive film shown in FIG. 1.

Referring now also to FIGS. 4 and 5, FIG. 4 illustrates the magnetoresistance and magnetization measurements versus applied magnetic field for a granular MR structure 10 (as shown in FIG. 1) with a 50 Å Co layer 15 deposited at 150 degrees C on a thermal oxide layer 13, overcoated with 80 Å of Cu 17 and having a sheet resistance of 12 Ohms/square. All measures of the structures 10 were made at room temperature. Magnetoresistance was measure both perpendicular (curve 16) and parallel (curve 18) to the applied magnetic field. The difference between the two magnetoresistance measurement directions indicates residual anisotropic magnetoresistance (AMR) while the GMR is given as the average of the two measurements. A GMR of approximately 2.8 percent is observed. The full width at half maximum (FWHM) of each peak is 470 Oersteds (Oe) and the saturation field ($H_{sat}$, defined as the field axis intercept of the tangent at half maximum) is 700 Oe. For structures 10 with a 50 Å layer 15 of NiFe deposited at substrate temperatures between 200 and 300 degrees C on glass substrates and overcoated with a 80 Å layer 17 of Cu, a smaller GMR of 0.8 to 1.4 percent is observed, but at lower applied fields, with $H_c$ between 80 and 110 Oe, FWHM of c 180 to 300 Oe and $H_{sat}$ of 350 to 450 Oe.

FIG. 5 illustrates the GMR and AMR as a function of substrate temperature during deposition of the ferromagnetic layer 15 for a structure 10 having a 25 A layer 15 of NiFe on thermal oxide with an overcoat layer 17 of 40 Å of Cu. The GMR peaks at a substrate temperature of approximately 150 degrees C. The decrease in GMR at higher deposition temperatures is due to the coarsening of the NiFe island structure at the higher temperatures.

Table I provides results for structures 10 of different deposition thicknesses and clearly illustrates the effect of ferromagnetic island size. The larger GMR effect obtained for structures containing Co is expected from comparisons of Co and NiFe in continuous layer GMR structures. The lower saturation fields (as compared to the prior art cited above) obtained in the granular GMR structures of the present invention can be attributed to the reduced in-plane demagnetization of the pancake shape of the ferromagnetic particles 15. The fields required for magnetoresistance changes of NiFe structures are less than that for Co structures indicating that the crystalline anisotropy plays a role in the Co structures. The lower $H_c$ of the smaller particles may result from a more uniformly round shape, which is shown by Scanning Electron Microscope observations. This more uniform shape is expected from the relative importance of surface energy reduction in smaller particles. However, thermally assisted switching in smaller particles is also likely to contribute to reduced $H_c$ and the 25 Å NiFe structures are clearly superparamagnetic having increased FWHM and no residual moment. The structures having smaller ferromagnetic particles produce a larger magnitude of GMR, consistent with a smaller spacing between particles and larger area for interaction.

TABLE I

| NiFe Å | Co Å | Cu Å | AMR % | GMR % | Hc Oe | FWHM Oe | $H_{sat}$ Oe |
|---|---|---|---|---|---|---|---|
| 100 | — | 70 | 0.45 | 0.44 | 200 | 485 | 800 |
| 50 | — | 80 | 0.38 | 0.90 | 80 | 180 | 350 |
| 25 | — | 40 | 0.25 | 2.10 | ≦4 | 380 | 550 |
| — | 80 | 80 | 0.48 | 2.08 | 390 | 700 | 1100 |
| — | 40 | 40 | 0.28 | 2.71 | 141 | 500 | 700 |

Figure 6:
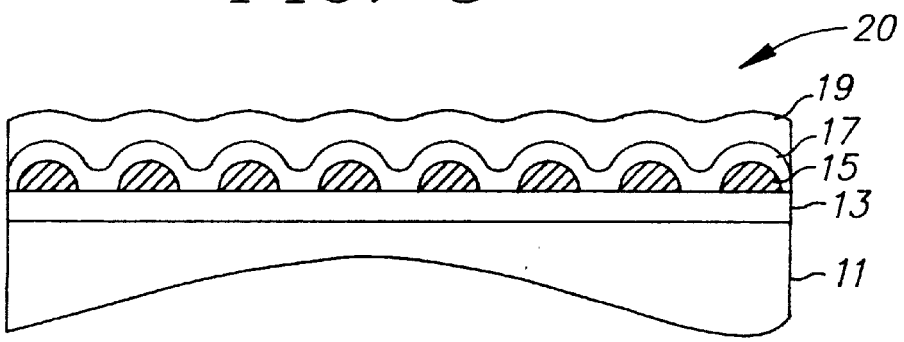
FIG. 6 is a cross-sectional view of another preferred embodiment of the granular magnetoresistive film shown in FIG. 1.

Referring now also to FIG. 6, a cross-sectional view illustrating another embodiment 30 of the single layer granular MR film described with reference to FIG. 1 is shown. As described above, a discontinuous layer of ferromagnetic particles 15 is formed on a nonconductive layer 13 over substrate 11 with an overlayer 17 of a nonmagnetic, conductive material formed over the layer of ferromagnetic particles 15. A continuous layer 19 of magnetic material is then formed over the overlayer 17 of conductive matrix material. Use of the magnetic overlayer 19 provides a substantial increase of the magnetoresistance observed for the structure 30. However, since the magnetic overlayer 19 is likely to be multi-domain, in an actual sensing device, noise due to domain wall movement will be present. In a sensing device, the magnetic overlayer 19 will be of a high coercivity material with its magnetic anisotropy initialized in a desired orientation to minimize Barkhausen noise.

Figure 7:
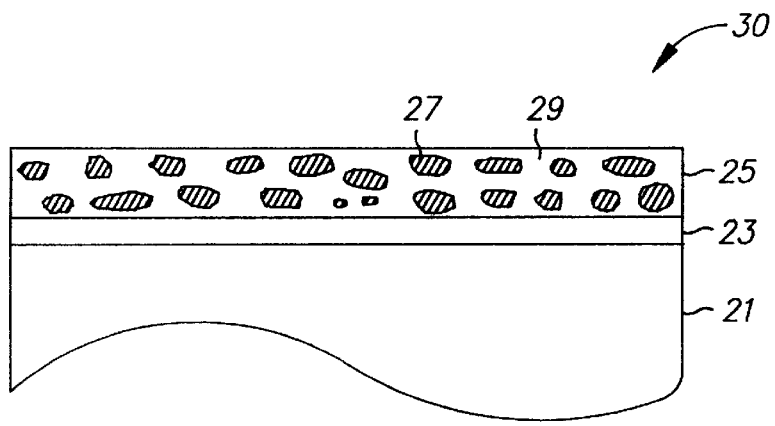
FIG. 7 is a cross-sectional view illustrating another preferred embodiment of the granular magnetoresistive film of the present invention fabricated by co-deposition techniques.

Referring now also to FIG. 7, a cross-section view of another preferred embodiment 30 of a single layer granular MR film fabricated according to the principles of the present invention is shown. A single layer film 25 of a ferromagnetic material and a nonmagnetic, conductive material is formed by co-sputtering from separate targets on a nonconductive layer 23 over a suitable substrate 21. The ferromagnetic and nonmagnetic conductive materials are co-deposited at room temperature and subsequently annealed at an elevated temperature to produce a heterogeneous film 25 of ferromagnetic particles 27 in a nonmagnetic conductive matrix 29. The ferromagnetic material and the nonmagnetic material are chosen such that the tow materials are mutually immiscible in which phase separation of the materials will occur. Alternatively, the ferromagnetic and matrix materials can be miscible or partially miscible under equilibrium conditions processed in a controlled manner to limit interdiffusion.

Figure 8:
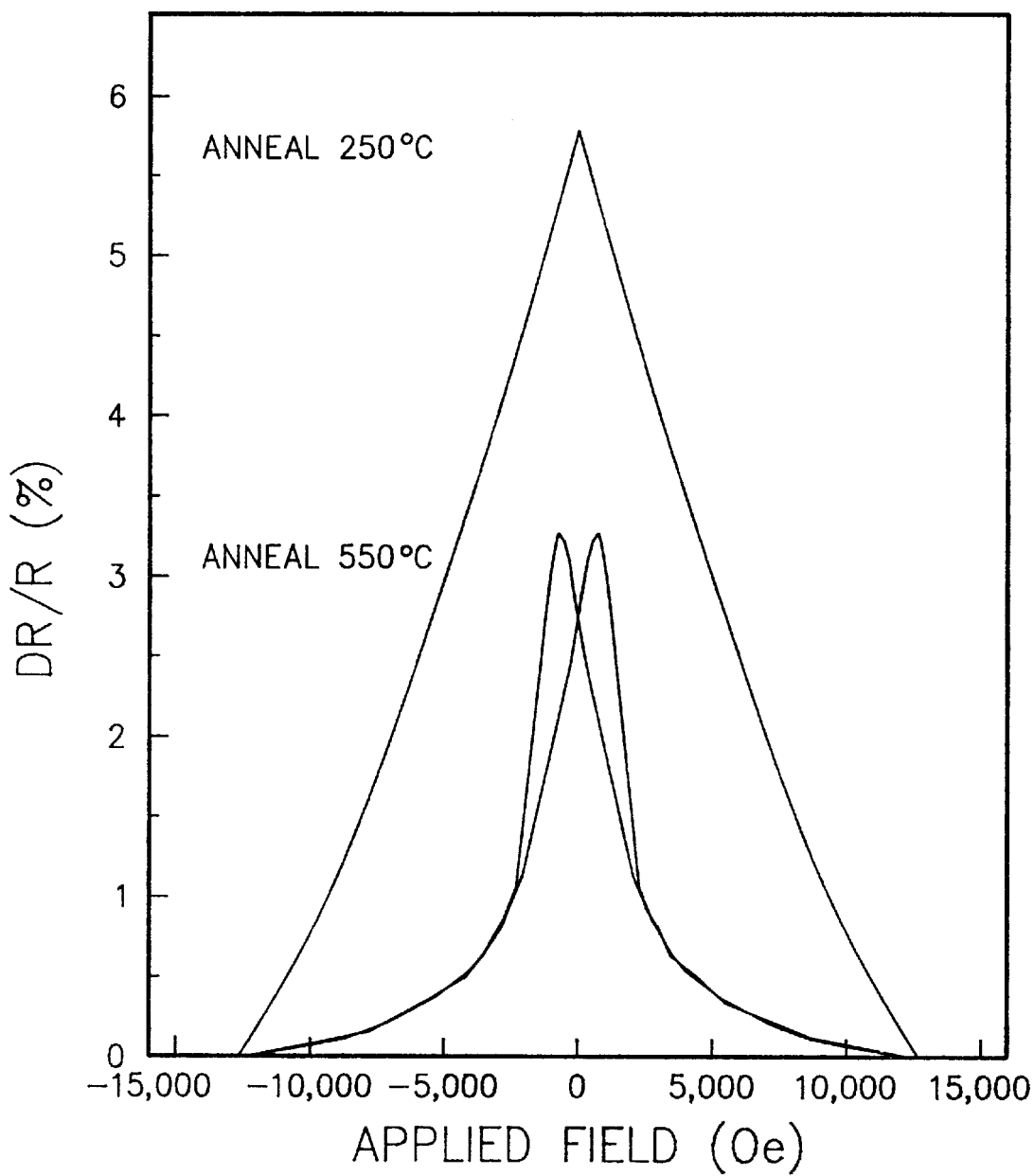
FIG. 8 is a graph which illustrates the magnetoresistance versus applied magnetic field for the granular magnetoresistive film shown in FIG. 7.

In a specific embodiment, a 25 percent Co granular GMR film 25 is formed by co-sputtering Co and Cu from separate targets onto a oxidized Si substrate 21 and is subsequently annealed at temperatures in the range of 200 to 600 degrees C. FIG. 8 is a graph which illustrates the MR versus applied magnetic field obtained in the granular film having the above structure. While the higher anneal temperatures produce a lower MR value, both the magnetic fields required and the FWHM achieved are significantly lower. Since both Ni and Fe show very limited solubility in Ag and, conversely, Ag shows very little solubility in Ni or Fe at temperatures less than approximately 500 degrees C, granular MR films of NiFe/Ag are expected to show good results. However, because of the large crystal anisotropy exhibited by Co, compared to NiFe, NiFe systems are expected to exhibit lower values of MR. Other deposition or film-forming processes may also be used, Such as, plating, ion deposition or pastes or other mechanical methods. Additionally, it is not required that the anneal process be performed subsequent to completion of the deposition process. Deposition may be done at elevated temperatures or on heated substrates to achieve the desired granular magnetic structures.

As in the well-known magnetic/nonmagnetic multilayer spin valve systems described in the prior art, the origin of the MR observed in the granular single layer structures 10, 20, 30 is believed to be primarily due to spin-dependent scattering of conduction electronics traversing the matrix between the magnetic regions or particles. While it is recognized that larger particles may comprise more than one or multiple magnetic moments, for analysis, it can be assumed that each of the particles behave as if it constituted a single magnetic moment or domain (as shown in FIG. 7). If the magnetic moments of the particles are randomly oriented, spin dependent scattering from particle to particle is increased resulting in a relatively high resistivity for the structure. On the other hand, if the magnetic moments of the particles are aligned in a parallel orientation, the resistance decreases to a relatively low value. While it is recognized that magnetostatic and exchange coupling exists between the particles in the matrix, a single particle model analysis which neglects interactions between particles is sufficient to show the that the observed MR is strongly dependent on the particle size, shape and anisotropy.

Figure 9:
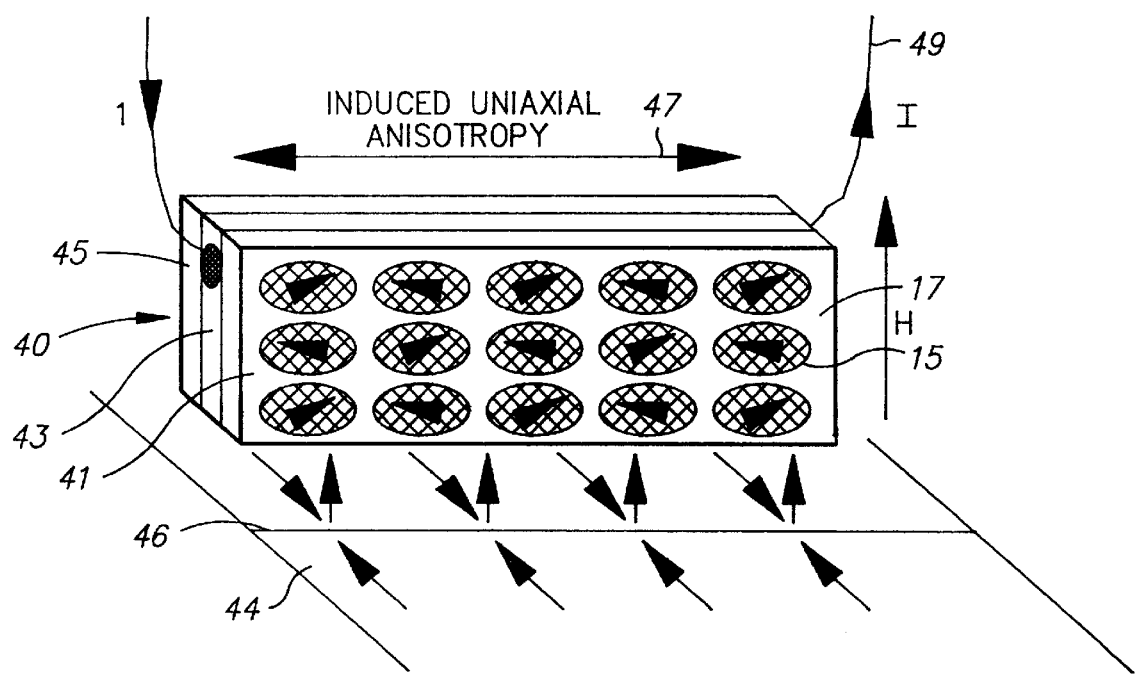
FIG. 9 is a view in perspective of a conceptual MR sensor employing the granular magnetoresistive film of the present invention.

Referring now also to FIG. 9, a conceptual diagram of an MR sensor 40 arranged in sensing relationship with a data track 44 defined on a magnetic recording media surface, for example, is illustrated. The MR sensor 40 comprises an MR sensing element 41, a bias layer 45 separated from the sensing element 41 by a nonmagnetic spacer layer 43 and is connected to a current source (not shown) by conductors 49 to provide a sensing current I to the MR sensor 41. The MR sensing element 41 is a granular magnetic structure as described above with reference to FIGS. 1–3, 6 or 7 including a layer of ferromagnetic particles 15 in a metallic conductive matrix 17. The magnetic moments of the particles 15 may be partially oriented along an induced magnetic anisotropy axis, as shown by arrow 47. A magnetic anisotropy axis may be induced in the MR sensing element 41 by an annealing cycle in the presence of a magnetic field in the direction of the desired anisotropic axis, as is known in the art. The bias field provided by the bias layer 45 will further align the moments of the particles 15 in a desired direction to adjust the operating point of the MR sensor at a linear portion of its response characteristic. The MR sensor 40 is suspended above a data track 44 by a suspension apparatus (not shown) such that the magnetic field H at a data transition 46 will be applied in the plane of the sensing element 41. When the field H is intercepted, the magnetic moments rotate to align with the applied field H resulting in a decrease in the resistivity in the sensing element 41. Since rotation of the magnetization of the magnetic particles occurs with limited domain wall motion, a longitudinal bias field for the sensing element is not required.

While the present invention has been particularly shown and described with reference to preferred embodiments thereof, it will be understood by those skilled in the art that various changes in form and detail may be made therein without departing from the spirit, scope and teaching of the invention. For example, while the preferred embodiment shown is described as an unshielded device, the MR sensor of the present invention is equally applicable to a shielded or flux-guided structure. Accordingly, the invention herein disclosed is to be considered merely as illustrative and limited in scope only as specified in the appended claims.

We claim:

1. A magnetoresistive (MR) sensor, comprising:
    an MR sensing element for reading information recorded in a magnetic medium, said MR sensing element having an MR effect, said MR sensing element including:
        a layer of particles of ferromagnetic material embedded in a layer of nonmagnetic, electrically conductive material, the MR effect of said MR sensing element being the function of spin-dependent scattering of conduction electrons within said MR sensing element;
    a bias layer of a magnetic material for providing a magnetic bias field for said MR sensing element; and
    a spacer layer of a nonmagnetic material disposed between said bias layer and said magnetoresistive sensing element.

2. A magnetoresistive (MR) sensor, comprising:
    an MR sensing element for reading information recorded on a surface of a magnetic medium, said MR sensing element including:
        particles of ferromagnetic material embedded in a layer of nonmagnetic, electrically conductive material, said MR sensing element having a plurality of magnetic domains, each magnetic domain having a magnetic moment, said magnetic moments rotating in response to reading information;
    a bias layer of a magnetic material for providing a magnetic bias field for said MR sensing element; and
    a spacer layer of a nonmagnetic material disposed between said bias layer and said magnetoresistive sensing element.

3. A magnetoresistive (MR) sensor, comprising:
    an MR sensing element for reading information recorded on a surface of a magnetic medium, said MR sensing element including:
        particles of ferromagnetic material embedded in a layer of nonmagnetic, electrically conductive material, said MR sensing element having a plurality of magnetic domains, each magnetic domain having a magnetic moment, said magnetic moments being randomly oriented and rotating in response to reading information;
    a bias layer of a magnetic material for providing a magnetic bias field for said MR sensing element; and
    a spacer layer of a nonmagnetic material disposed between said bias layer and said magnetoresistive sensing element.

4. A magnetoresistive (MR) sensor, comprising:
    an MR sensing element for reading information, said MR sensing element including:
        particles of ferromagnetic material embedded in a layer of nonmagnetic, electrically conductive material, said MR sensing element having a plurality of magnetic domains, each magnetic domain having a magnetic moment, said magnetic moments being randomly oriented and rotating in response to reading information;
    a bias layer of a magnetic material for providing a magnetic bias field for said MR sensing element; and
    a spacer layer of a nonmagnetic material disposed between said bias layer and said magnetoresistive sensing element.

* * * * *